(12) United States Patent
Freking et al.

(10) Patent No.: US 6,307,489 B1
(45) Date of Patent: Oct. 23, 2001

(54) FAST AND SMALL SERIAL HUFFMAN DECODER FOR DECODING AT AN OPTIMALLY HIGH RATE

(76) Inventors: Robert Allen Freking, 2258 Timberlea Dr., Woodbury, MN (US) 55125-3001; Keshab K. Parhi, 27492 Avanti Dr., Mission Viejo, CA (US) 92692

( * ) Notice: Subject to any disclaimer, the term of this patent is extended or adjusted under 35 U.S.C. 154(b) by 0 days.

(21) Appl. No.: 09/526,005

(22) Filed: Mar. 15, 2000

(51) Int. Cl.[7] .............................. H03M 7/40; H03M 7/00
(52) U.S. Cl. ............................................... 341/65; 341/79
(58) Field of Search ................................. 341/65, 51, 107, 341/79

(56) References Cited

U.S. PATENT DOCUMENTS 5,153,591 * 10/1992 Clark ........................................ 341/51
5,583,500 * 12/1996 Allen et al. ............................ 341/107
5,602,550 * 2/1997 Stein ....................................... 341/76
5,923,785 * 7/1999 Dube ..................................... 382/240

* cited by examiner

*Primary Examiner*—Peguy JeanPierre
*Assistant Examiner*—Jean Bruner JeanGlaude

(57) ABSTRACT

A serial Huffman decoder that is concise and capable of extremely high rates of operation is described. Optimal speed is attained because the critical-path of an embodying circuit has only a memory in the critical path. No other functions or operations are entailed. This being the only unequivocally essential device in the implementation of a mapping such as Huffman, the critical path is blatantly optimal. The codetable, composed of a specially modified Huffman binary tree, is much more compact than the typical Huffman binary tree.

10 Claims, 2 Drawing Sheets

FAST AND SMALL SERIAL HUFFMAN DECODER FOR DECODING AT AN OPTIMALLY HIGH RATE

STATEMENT REGARDING FEDERALLY SPONSORED RESEARCH

Research for this invention was supported by the Army Research Office under grant number DAAG55-98-1-0203.

CROSS-REFERENCE TO RELATED APPLICATIONS

Not applicable.

BACKGROUND OF THE INVENTION

1. Field of the Invention

The present invention relates to the processing of digital signals to render Huffman coding with minimal of hardware.

2. Description of Related Art

The digital-signal processing technique of Huffman coding is one of the most pervasive compression means in use today. It has earned a principle position as an enabling component in more sophisticated and specialized compression standards, such as CCITT (facsimile), JPEG (image) and MPEG (video) coding. The art bears this popularity out. Unparalleled speed and simplicity are at the core of its appeal. Yet, known implementations are neither adequately fast nor sufficiently uncomplicated to match the performance demands exacted by modern applications. Most of the art focuses on either reducing memory consumption or raising performance, but few attempt both simultaneous.

A Huffman decoder receives as input a variable-length encoded codeword and generates as output a fixed-length decoded symbol. If the Huffman codetable—the mapping between input codewords and output symbols—is stored directly, the resultant decoder would be fast, but exorbitantly large. This is never done in practice.

The mapping can be decomposed into smaller codetables, where data is processed over each simultaneously with only one responding with a decoding. This approach is fast for large codewords, but the resultant circuits are needlessly complex and consumptive of space.

It is known that the codetable can be stored as a set of pointers implementing a binary tree, with branches associated with codeword bits and leaves associated with symbols. This arrangement is reasonably compact, but requires a unit increment operation. A modification of this arrangement requires less memory at the expense of a variable increment operation. Due to the nature of tree-based storage, such decoders are serial devices, receiving one bit of the codeword per cycle and producing one symbol after all bits of the codeword have been admitted.

Many decoding styles have the potential to process one symbol every cycle. Nevertheless, representatives of this class of coder, such as the mapping decomposition methods mentioned above, have much slower cycle periods than serial-decoder cycle periods as a result of their complexity. Therefore, though for large codewords the effective throughput engendered by releasing a symbol in one cycle is great, for small codewords the effective throughput is obviously worse. Since Huffman coding compresses by assigning small codewords to the most frequently occurring symbols, the ostensibly dramatic throughput of such devices does not, on average, occur. Serial decoders thus prove faster than these in many circumstances.

SUMMARY OF THE INVENTION

The present invention describes a serial Huffman decoder that is concise and capable of extremely high rates of operation. Optimal speed is attained with this invention because the critical-path of an embodying circuit has only a memory in the critical path, thereby minimizing the iteration period. No other functions or operations are entailed. This being the only unequivocally essential device in the implementation of a mapping such as Huffman, the critical path is blatantly optimal. The codetable, composed of a specially modified Huffman binary tree, is much more compact than the typical Huffman binary tree.

OBJECTS AND ADVANTAGES OF THE INVENTION

The primary object of this invention is the optimally fast serial processing of Huffman decoding.

It is an advantage of this invention that the critical path of a circuit embodying it is optimally short, consisting only of a memory. No arithmetic operations are entailed. Because Huffman coding involves a mapping of data, a memory is obligatory. Therefore, it is clear that the critical path is optimal.

It is the overriding advantage of this invention that operating speed is optimal for a given implementation of memory. This is a direct consequence of critical path optimality.

It is a clear advantage of this invention that the codetable remains programmable. Codetable programmability is a critical capability for optimizing compression ratios, but much of the art derives performance by forgoing this feature, hardwiring a specific code.

It is a noteworthy advantage of this invention that the modified tree arrangement constituting the codetable of the present invention is stored in roughly half the space of a conventional tree-based codetable.

It is a definite object and advantage of this invention that it is, as a whole, very compact. This follows from the previous advantage together with the fact that the entire invention comprises just a memory and a delay.

DETAILED DESCRIPTION OF PREFERRED EMBODIMENTS

Figure 1:
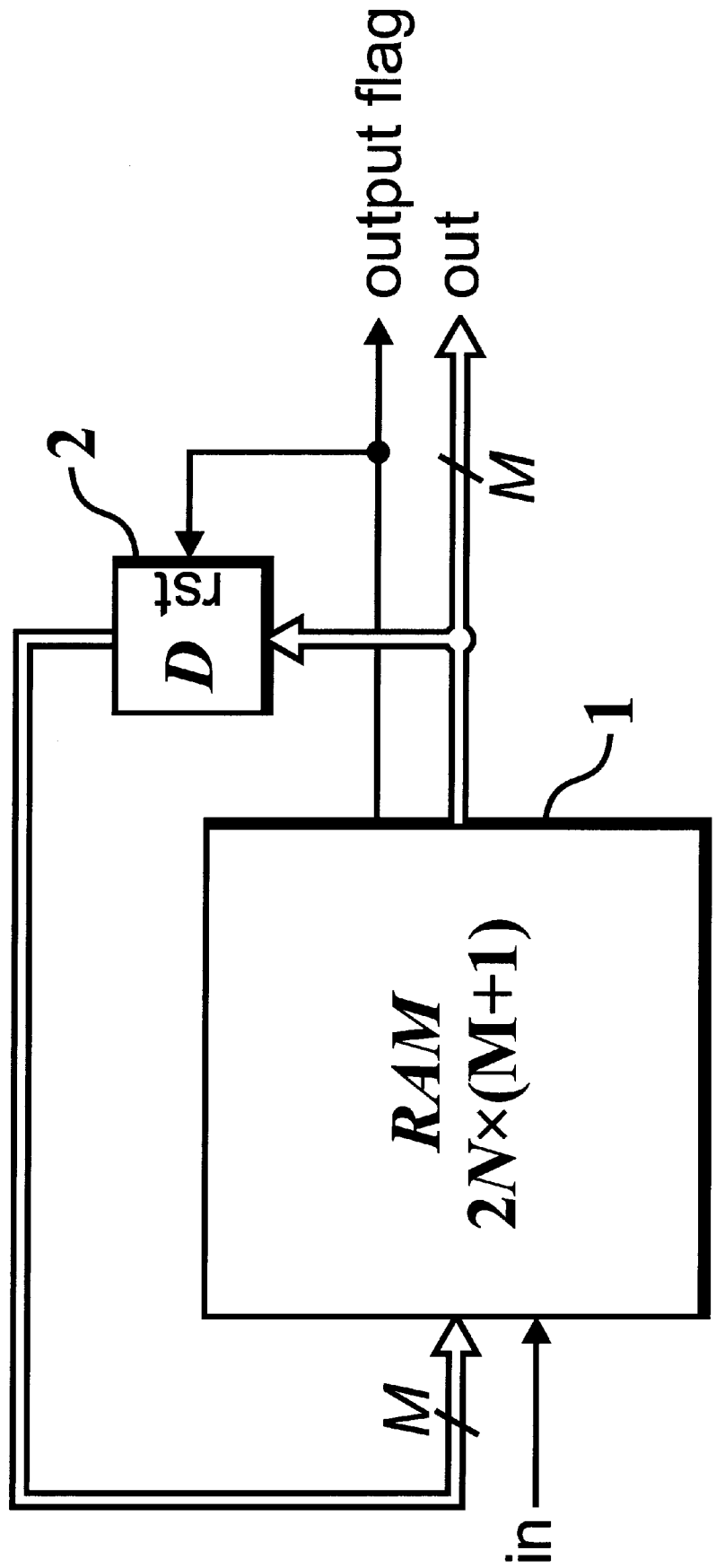
FIG. 1 illustrates the decoder with its connections.

The preferred embodiment is delineated in FIG. 1. It consists of a RAM memory 1 and a delay element 2. The RAM 1 holds 2N elements of M+1 bits each, where $M=\log_2 N$. The (M+1)-bit wide output of the RAM 1 consists of a 1-bit indicium and an M-bit wide group containing symbol data in some instances, and pointer data in others.

The M-bit datum is circulated back to the input in the next clock cycle by the delay 2, unless the indicium signals the termination of decoding by resetting the delay 2. In this case a nulled M-bit datum is returned to the input. The indicium also acts to flag the presence of output to the external environment on the line OUTPUT_FLAG. When OUTPUT_FLAG is raised, the M-bit datum output by RAM 1, and hence the line OUT, assert a symbol rather than a pointer. Thus, the indicium-initiated reset prevents symbols from propagating to the input, i.e., only when the M-bit datum is a pointer is it recirculated back to the output.

The input addressing the RAM 1 is a composite of the recirculated pointer datum and the incoming codeword bit on the line IN. Since this is a serial design one bit of each codeword is received during each cycle, progressively revealing the codeword. The symbol is not output until the last codebit is received.

Figure 2:
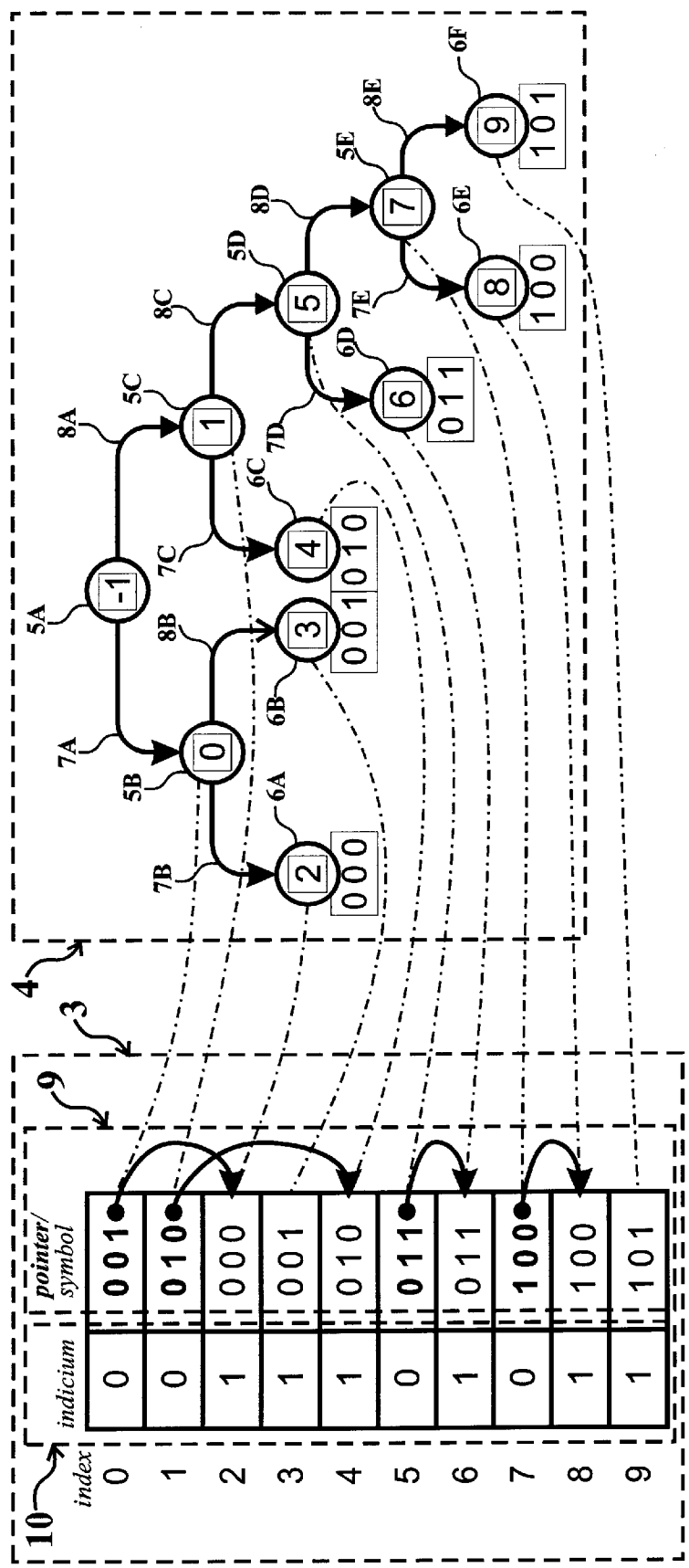
FIG. 2 depicts the Huffman binary tree and its arrangement in memory.

The arrangement 3 of the codetable in memory, depicted in the preferred embodiment in FIG. 2, is critical to this invention, enabling the concision of circuitry manifested in FIG. 1. This arrangement reflects the conceptual organization of the Huffman binary tree 4, which is a hierarchically organized subclass of directed graphs. Such a tree comprises a collection of nodes composed by means of a suitable algorithm, of which N nodes 5 are affiliated with the N distinct encoded symbols. The remaining N−1 nodes 6 serve as bifurcation sites extending edges of left disposition 7 and right disposition 8 that lead to pendant nodes of lower rank. Paths are thereby established between the topmost node 5A, designated the root node, and the lower-level symbol-associated terminal nodes 6, which are denoted as leaf nodes. By associating the left disposition 7 with a specified bit value of zero and the right disposition 8 with the negation of that value, one, an ordered listing of these values between the root and any leaf defines an unambiguously unique binary codeword. For example, symbol node 6D is accessible from the root node only by traversing branches in the sequence right-right-left or, specified in associated values, 1-1-0. The codeword 110 thus references the symbol of node 6D, which is, in this case, 001.

To associate memory indexes with the nodes 5,6 for storage in RAM 1, nodes 5,6 are enumerated in breadth-first order beginning with the root node 5A, which is assigned a fixed value of negative one. Nodes of left disposition 5B,6A,6C,6D,6E receive even-valued indexes while nodes of right disposition 5C,6B,5D,5E,6F receive odd-valued indexes. Data for node X is accordingly stored in position X in RAM 1. A datum consists of either the index of the child node pendant from the left-disposed edge of that node or the symbol associated with the node if the node possesses no children, i.e., the datum is either a pointer to a child node of left disposition or a symbol. Pointers to right children are not stored but are manufactured as necessary with the amalgam formed from pointers to children of the left disposition and line IN.

Because only even-valued, left-disposed indexes are referenced, pointers comprise only even numbers. The least-significant bit or ones bit of the binary representation of these pointers, being invariably zero, is not stored, but is restored by line IN when needed. The remaining bits serve as the modified pointer datum 9. Having omitted the ones bit, pointers word sizes are brought into equality with the bit-width of symbols, viz. $\log_2 N$ bits. Accordingly, pointer data 9 and symbol data 9 are stored together in RAM 1 without waste. The 1-bit indicium 10, which serves solely to distinguish symbol-associated leaf nodes 6 from intermediate nodes 5, is stored alongside the pointer/symbol datum 9. The root node 5A, being bounden and of known value, is also not stored.

Because children pendant in the right disposition are always located in memory one index position beyond the sibling node of the left disposition, incrementing the left-disposed child index by unity specifies the right-child index. Furthermore, each right-disposed child index is odd in value. It is therefore only necessary to supply a one bit in the absent one-bit position of any pointer to a node of left disposition to access the corresponding node of right-disposition. This is, by design, accomplished by directly supplying the incoming codeword bit on line IN as a replacement for the ones bit discarded in storage. Therefore, when IN is zero a child node of left disposition is referenced, whereas when it is one the sibling node of right disposition is identified. This process, which commences with an initial pointer value of zero, is repeated according to the recirculation mechanism already described, building complete indexes to right-disposed or left-disposed children from amalgams of a pointer and the value of IN. In so doing, the tree is traversed from an implied root to a symbol without entailing arithmetic operations. Instead, a succession of pointers to progressively deeper levels of the tree are generated on OUT until a leaf node is reached and a symbol is produced.

Since the preferred embodiment incorporates RAM 1, the codetable may be easily reprogrammed by storing new content.

What is claimed is:

1. A machine for processing Huffman-coded digital signals into decoded signals, comprising:

(a) storage, which stores a tree arrangement comprising a plurality of entries selected from the group consisting of:

(1) a regularly disposed symbol, with indicium, (2) a regularly disposed index, with indicium, referencing an entry selected from the group consisting of:

(I) said regularly disposed symbol, and (II) a different entity of regularly disposed index, thereof, (3) an oppositely disposed symbol, with indicium, associated with an entry selected from the group consisting of:

(I) said regularly disposed symbol, and (II) said regularly disposed index, (4) an oppositely disposed index, with indicium, referencing an entry selected from the group consisting of:

(I) said regularly disposed symbol, and (II) said regularly disposed index, and associated with an entry selected from the group consisting of:

(I) said regularly disposed symbol, and (II) said regularly disposed index, such that a hierarchy is developed comprising:

(1) only one unreferenced regularly disposed entry, chosen from the group consisting of:

(I) said regularly disposed symbol, and (II) said regularly disposed index, (2) only one unreferenced oppositely disposed entry, chosen from the group consisting of:

(I) said oppositely disposed symbol, and (II) said oppositely disposed index (3) a plurality of referenced entries, such that:

(1) a sequence of dispositions is formed, by:

(I) initially focusing concern on an entry from the group consisting of:

(i) said unreferenced regularly disposed entry, and (ii) said unreferenced oppositely disposed entry.

(II) recursively:

(i) recording the disposition of a concerned entry (ii) changing the focus of concern to an entry selected from the group consisting of:

(A) said concerned entry's referenced entry, and (B) said associated entry of said concerned entry's said referenced entry, until said concerned entry is a symbol.

(2) said sequence of dispositions is in direct correspondence with a sequence of bit values associated by Huffman coding with said symbol terminating sequence of dispositions thereof, (b) a delay connected between the output of said storage and the input of storage thereof, detaining a recalled result from said storage comprising a plurality of bits corresponding to said stored index, controlled by a portion of said recalled result corresponding to said stored indicium, (c) an input line delivering Huffman-coded codewords to said storage a bit per cycle, wherein Huffman decoded signal are emitted at said output.

2. The machine of claim 1 wherein said storage is a memory.

3. The machine of claim 2 wherein:

(a) said regularly disposed entries are stored at locations in said memory specified by even indexes, (b) said oppositely disposed entries are stored at locations in said memory specified by odd valued numerical indexes, (c) the ones-place bit of said entries that are indexes is not stored, wherein arithmetic operations are avoided, and wherein the iteration period is minimized.

4. The machine of claim 1 wherein:

(a) said regularly disposed entries are stored at locations in said storage specified by even indexes, (b) said oppositely disposed entries are stored at locations in said storage specified by odd indexes, (c) the least-significant bit of said entries that are indexes is not stored, whereby arithmetic operations are avoided, and whereby the critical-path measure of processing is optimal.

5. A method for processing Huffman-coded digital signals into decoded signals, comprising:

(a) storing a tree arrangement comprising a plurality of entries selected from the group consisting of:

(1) a regularly disposed symbol, with indicium, (2) a regularly disposed index, with indicium, referencing an entry selected from the group consisting of:
  (I) said regularly disposed symbol, and
  (II) a different entity of regularly disposed index, thereof, (3) an oppositely disposed symbol, with indicium, associated with an entry selected from the group consisting of:
  (I) said regularly disposed symbol, and
  (II) said regularly disposed index, (4) an oppositely disposed index, with indicium, referencing an entry selected from the group consisting of:
  (I) said regularly disposed symbol, and
  (II) said regularly disposed index, and associated with an entry selected from the group consisting of:
  (I) said regularly disposed symbol, and
  (II) said regularly disposed index, such that a hierarchy is developed comprising:

(1) only one unreferenced regularly disposed entry, chosen from the group consisting of:
  (I) said regularly disposed symbol, and
  (II) said regularly disposed index, (2) only one unreferenced oppositely disposed entry, chosen from the group consisting of:
  (I) said oppositely disposed symbol, and
  (II) said oppositely disposed index (3) a plurality of referenced entries, such that:

(1) a sequence of dispositions is formed, by:
  (I) initially focusing concern on an entry from the group consisting of:
    (i) said unreferenced regularly disposed entry, and
    (ii) said unreferenced oppositely disposed entry.
  (II) recursively:
    (i) recording the disposition of a concerned entry
    (ii) changing the focus of concern to an entry selected from the group consisting of:
      (A) said concerned entry's referenced entry, and
      (B) said associated entry of said concerned entry's said referenced entry,
  until said concerned entry is a symbol.

(2) said sequnce of dispositions is in direct correspondence with a sequence of bit values associated by Huffman coding with said symbol terminating sequence of dispositions thereof, (b) recalling an entry according to Huffman-coded codewords presented one bit per step, (c) delaying a portion of said recalled entry comprising said stored index by one step according to a portion of said recalled entry comprising said indicium, Huffman decoded symbols are produced.

6. The method of claim 5 wherein:

(a) said regularly disposed entries are referenced by even indexes, (b) said oppositely disposed entries are referenced by odd indexes, (c) least-significant bits representing indexes are ignored, whereby arithmetic computations are avoided, and whereby the steps of the method are minimal in quantity and complexity.

7. A machine for processing Huffman-coded digital signals into decoded signals, comprising:

(a) storage, which stores a pointer-based representation of a Huffman binary tree modified such that:
  (1) the root node is not stored,
  (2) pointers to regularly disposed children are stored, with indicium
  (3) pointers to oppositely disposed children are not stored,
  (4) symbols are stored with indicium, inline in normal child positions of said storage, (b) a delay connected between the output of said storage and the input of storage thereof, detaining a recalled result from said storage comprising a plurality of bits corresponding to said stored pointer, controlled by a portion of said recalled result corresponding to said stored indicium, (c) an input line delivering Huffman-coded codewords to said storage a bit per cycle, Huffman decoded signal are emitted at said output.

8. The machine of claim 7 wherein:
(a) said regularly disposed children are stored at locations in said storage specified by even pointer values,
(b) said oppositely disposed children are stored at locations in said storage specified by odd enumerated pointer values,
(c) the one-place bit of said pointers is not stored, wherein arithmetic operations are avoided, and
wherein the iteration period is minimized.

9. The machine of claim 7 wherein said storage is a memory.

10. The machine of claim 9 wherein:
(a) said regularly disposed children are stored at locations in said memory specified by even pointer values,
(b) said oppositely disposed children are stored at locations in said memory specified by odd pointer values,
(c) the least-significant bit of said pointers is not stored, whereby arithmetic operations are avoided, and
whereby the critical-path measure of processing is optimal.

* * * * *